(12) United States Patent
Honma

(10) Patent No.: US 8,164,961 B2
(45) Date of Patent: Apr. 24, 2012

(54) NONVOLATILE SEMICONDUCTOR MEMORY DEVICE WHICH CAN ELECTRICALLY REWRITE DATA AND SYSTEM THEREFOR

(75) Inventor: Mitsuaki Honma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 12/685,982

(22) Filed: Jan. 12, 2010

(65) Prior Publication Data

US 2010/0177567 A1    Jul. 15, 2010

(30) Foreign Application Priority Data

Jan. 14, 2009  (JP) ................................. 2009-005850

(51) Int. Cl.
*G11C 7/00* (2006.01)
*G11C 7/22* (2006.01)

(52) U.S. Cl. ......... 365/189.15; 365/185.21; 365/189.07; 365/207; 365/189.05

(58) Field of Classification Search ............. 365/185.21, 365/189.07, 189.15, 207, 189.05
See application file for complete search history.

(56) References Cited

U.S. PATENT DOCUMENTS

| 4,748,594 | A  | * | 5/1988 | Iida ............................... 365/200 |
| 5,535,162 | A  | * | 7/1996 | Uenoyama .................... 365/200 |
| 7,209,391 | B2 | * | 4/2007 | Urabe et al. ............. 365/185.23 |
| 7,596,045 | B2 | * | 9/2009 | DeBrosse et al. ............. 365/209 |

FOREIGN PATENT DOCUMENTS

| JP | 62-024498 | * | 2/1987 |
| JP | 6-83716 |   | 3/1994 |

* cited by examiner

*Primary Examiner* — Hoai V Ho
*Assistant Examiner* — Kretelia Graham
(74) *Attorney, Agent, or Firm* — Oblon, Spivak, McClelland, Maier & Neustadt, L.L.P.

(57) ABSTRACT

A nonvolatile semiconductor memory device includes a memory cell, latch circuits, and an arithmetic operation circuit. The memory cell stores data by a difference in threshold voltage. A read operation is performed twice or more on the memory cell under the same read conditions, and the latch circuits store a plurality of read data. The arithmetic operation circuit takes majority decision of the plurality of data stored in the latch circuits and decides data determined by the majority decision as data stored in the memory cell.

10 Claims, 8 Drawing Sheets

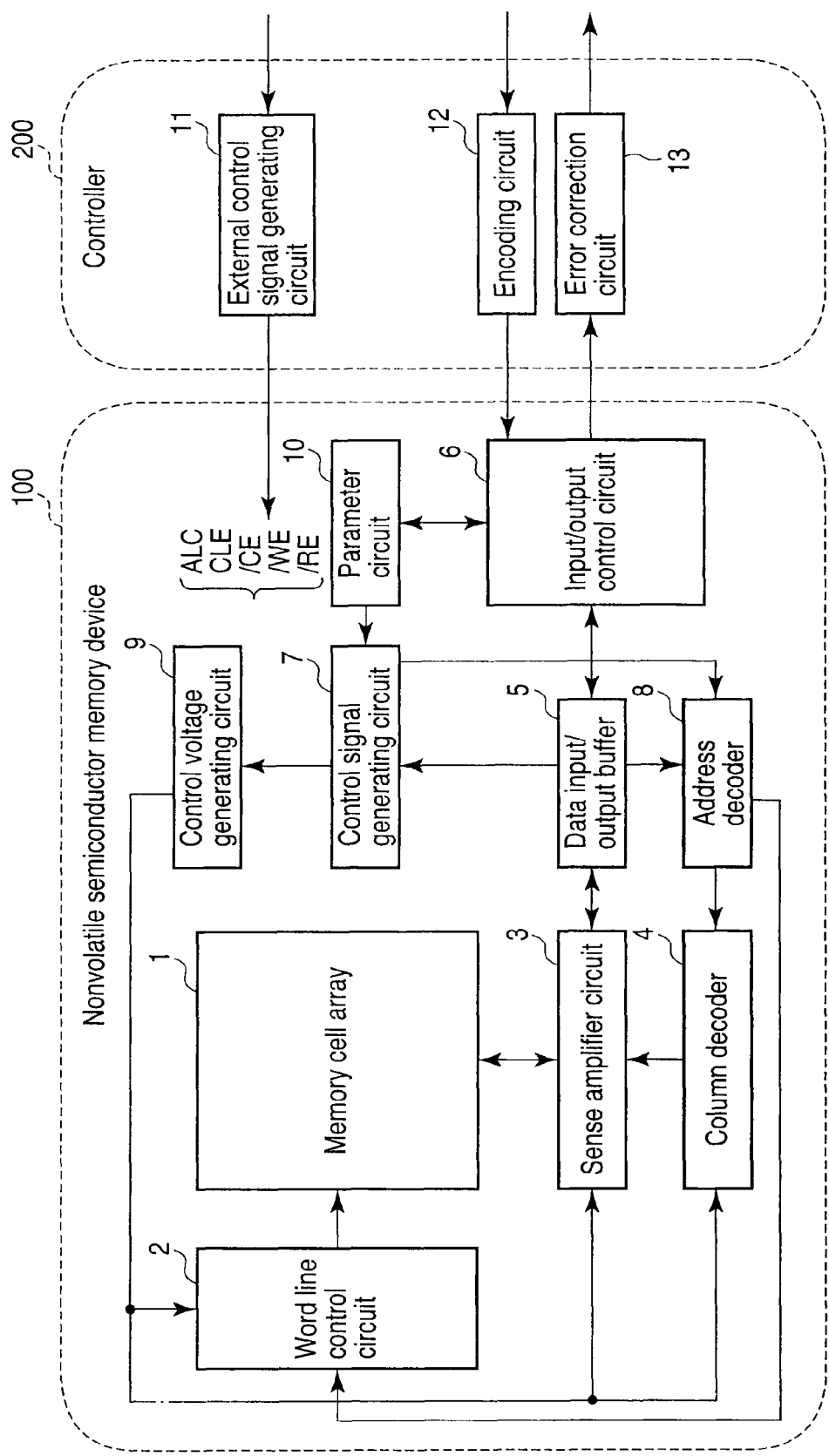
F I G. 1

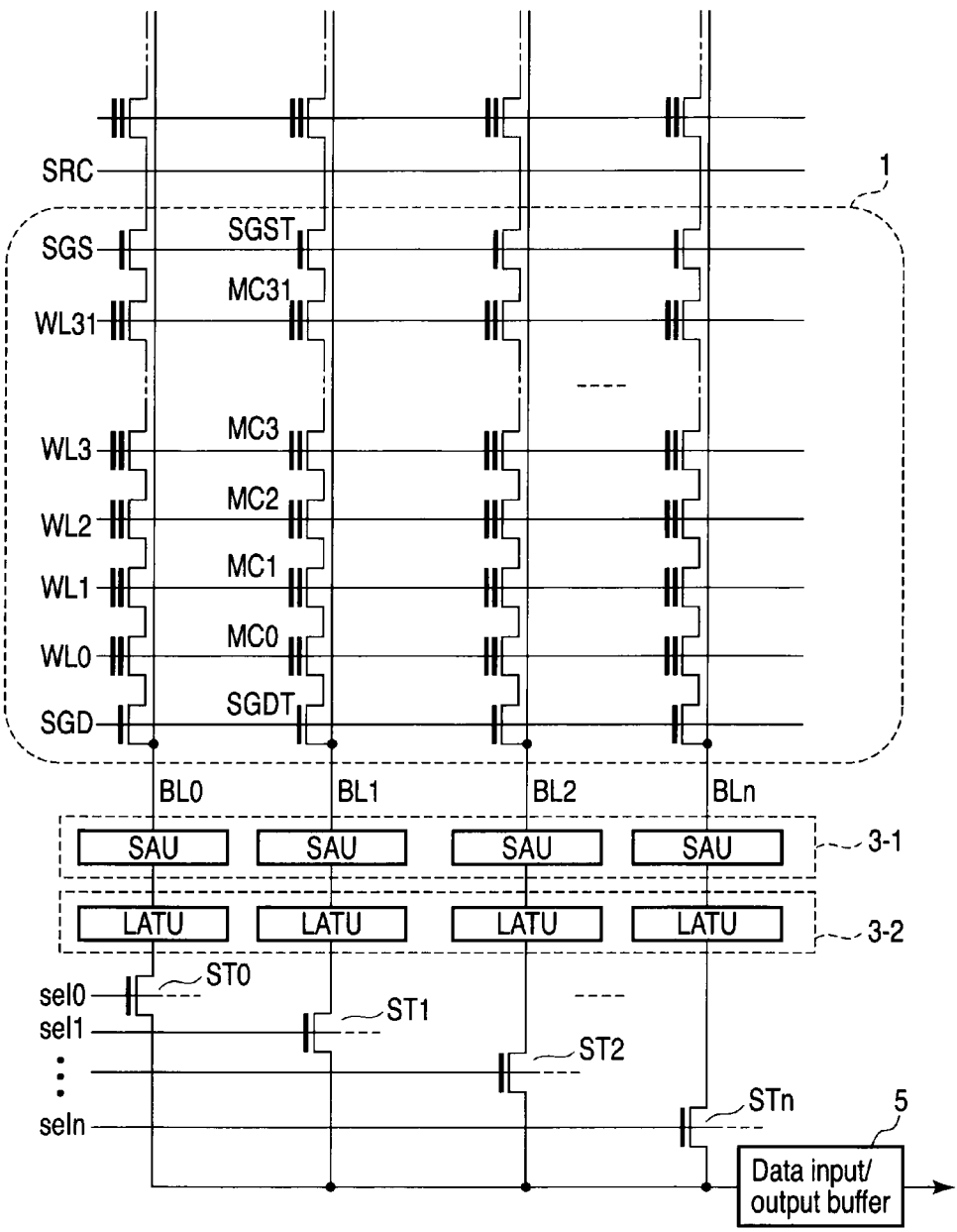
F I G. 2

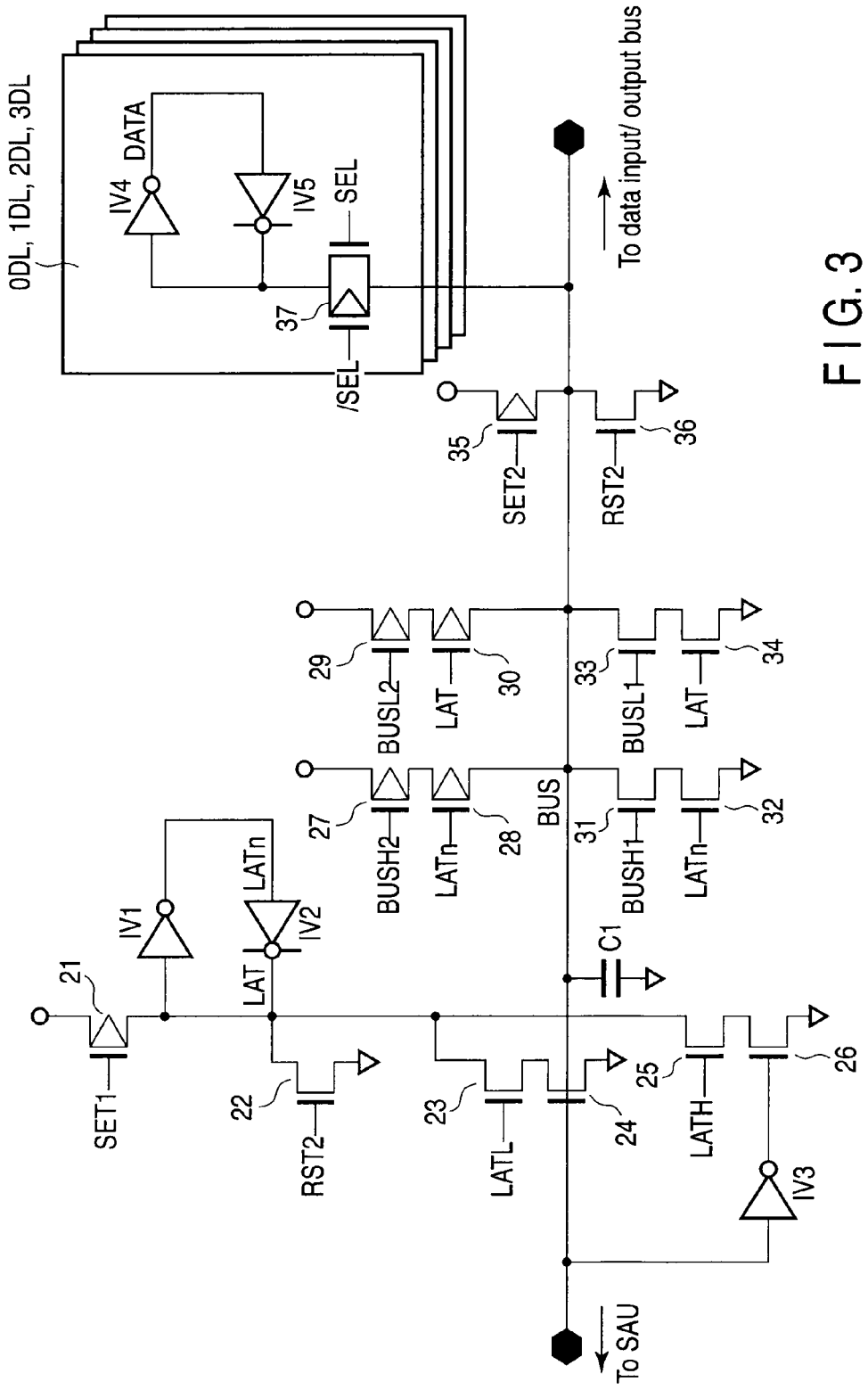
F I G. 3

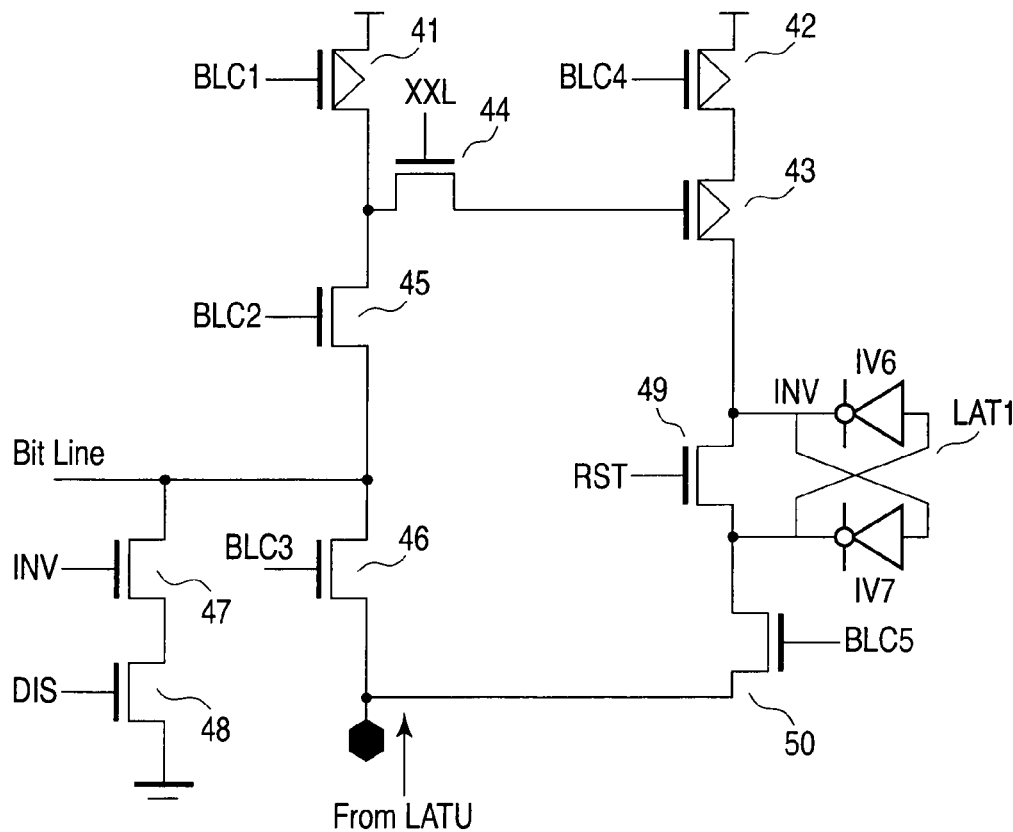
F I G. 4
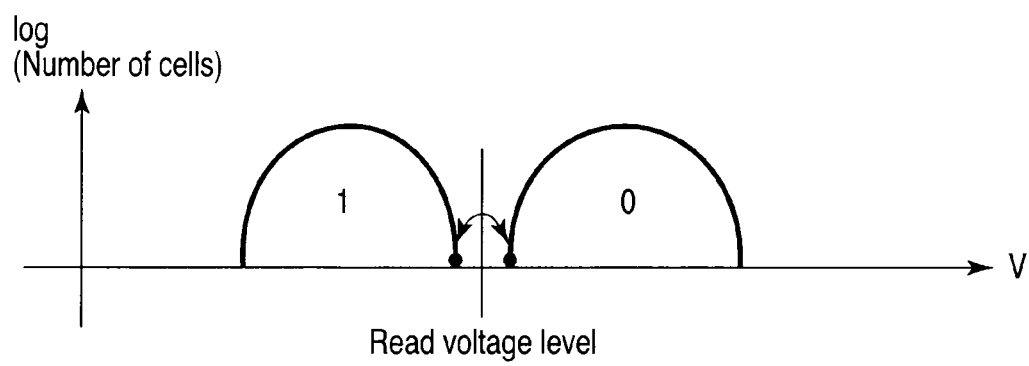
F I G. 5

| 0DL | 1DL | 2DL | 0DL & 1DL + 0DL & 2DL + 1DL & 2DL |
|---|---|---|---|
| 1 | 1 | 1 | 1 |
| 1 | 1 | 0 | 1 |
| 1 | 0 | 1 | 1 |
| 1 | 0 | 0 | 0 |
| 0 | 1 | 1 | 1 |
| 0 | 1 | 0 | 0 |
| 0 | 0 | 1 | 0 |
| 0 | 0 | 0 | 0 |

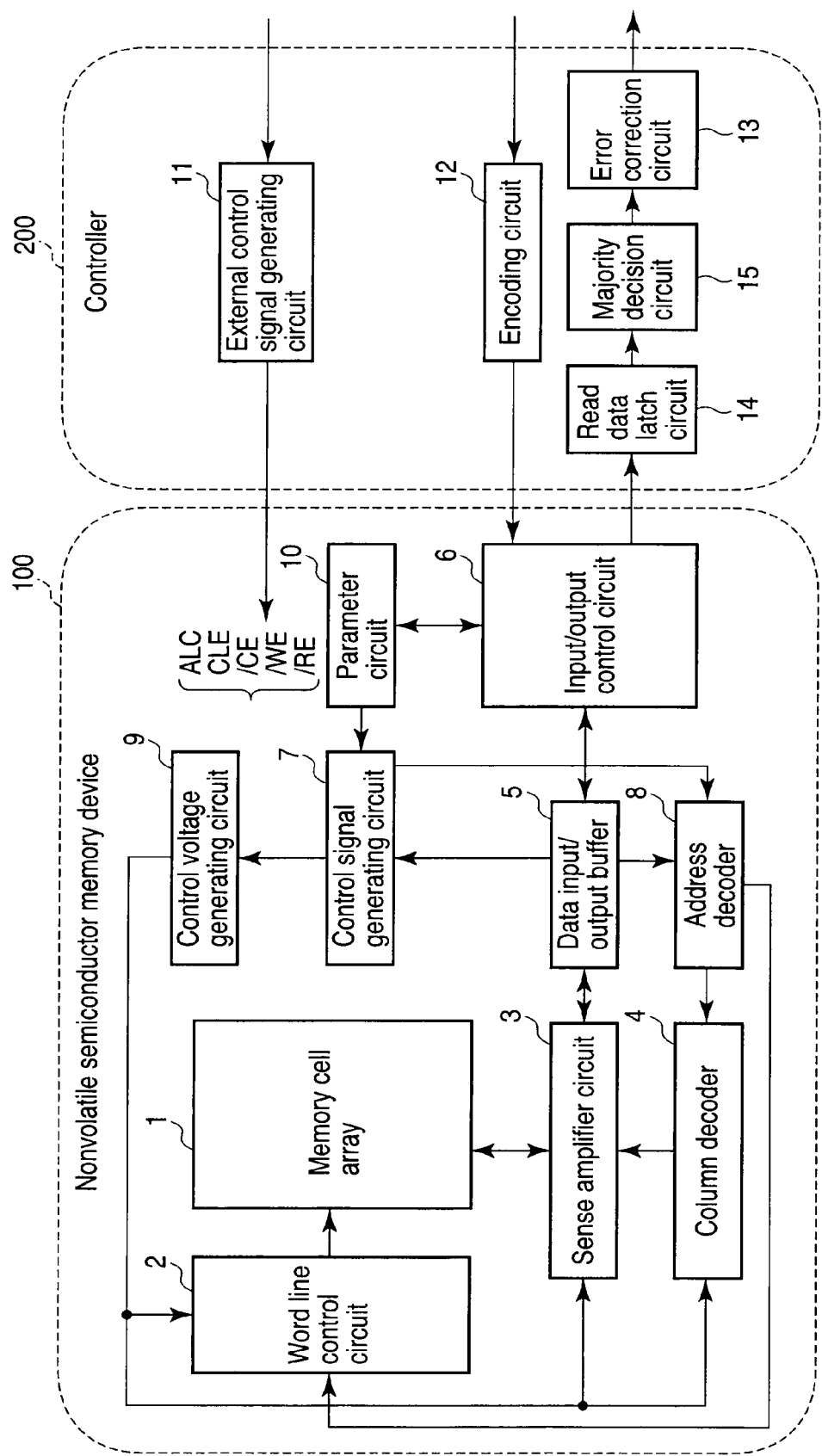
F I G. 8

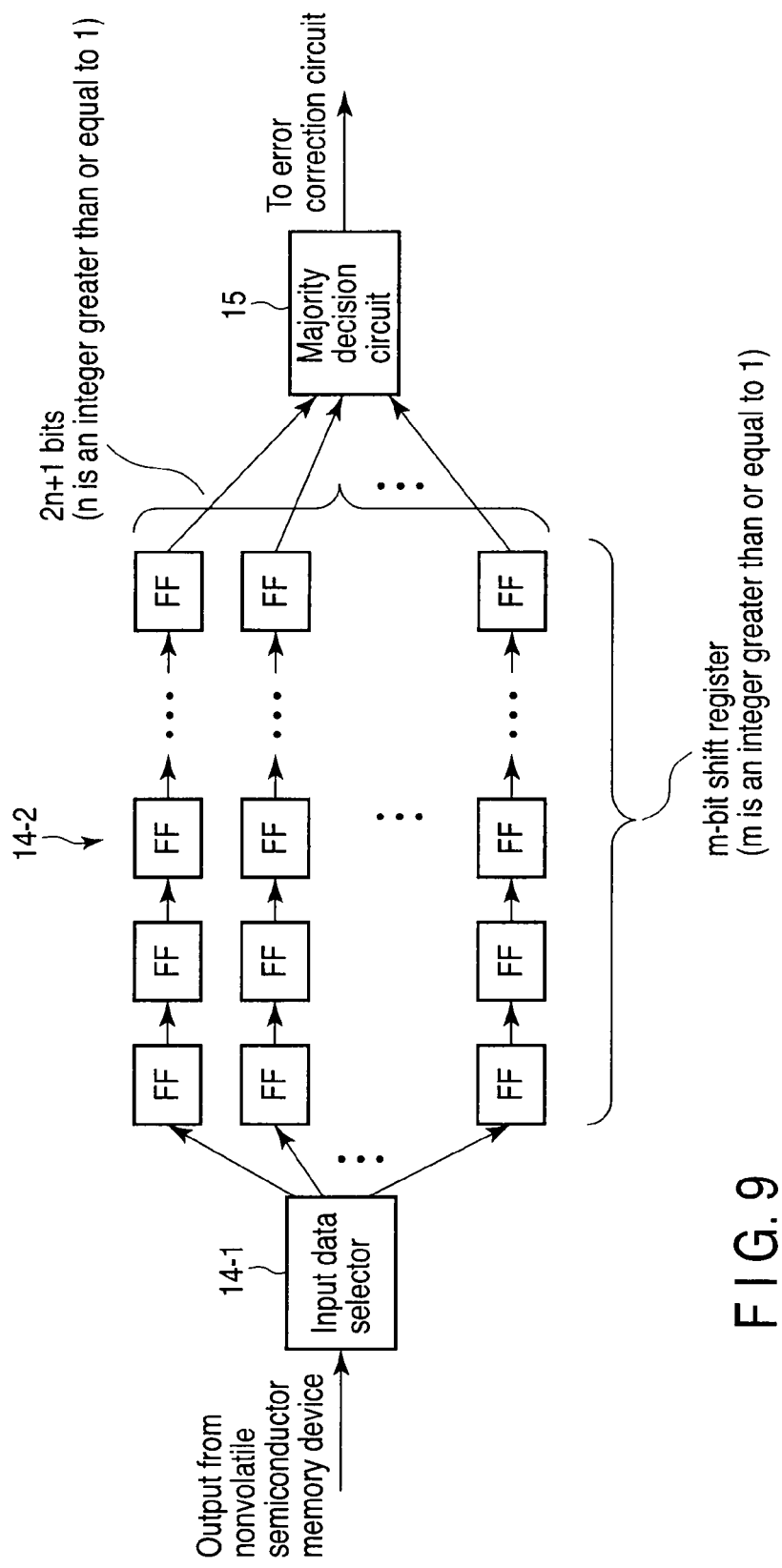
F I G. 9

NONVOLATILE SEMICONDUCTOR MEMORY DEVICE WHICH CAN ELECTRICALLY REWRITE DATA AND SYSTEM THEREFOR

CROSS-REFERENCE TO RELATED APPLICATIONS

This application is based upon and claims the benefit of priority from prior Japanese Patent Application No. 2009-005850, filed Jan. 14, 2009, the entire contents of which are incorporated herein by reference.

BACKGROUND OF THE INVENTION

1. Field of the Invention

The present invention relates to an electrically rewritable nonvolatile semiconductor memory device and a system therefor, for example, a NAND flash memory or a NAND flash memory and a controller therefor.

2. Description of the Related Art

In recent years, as nonvolatile semiconductor memory devices which can electrically rewrite data, NAND flash memories are widely used in a variety of apparatuses. The NAND flash memory includes a plurality of memory cells (referred to as NAND cells hereinafter) connected in series and selection gate transistors arranged at both ends of the NAND cells.

In the NAND flash memory, in a read operation, a memory cell having a threshold value close to a read voltage disadvantageously has a random error in which data may be correctly read or erroneously read.

Jpn. Pat. Appln. KOKAI Publication No. 6-83716 discloses the following device. Three pieces of identical data are prepared by a data generating circuit and redundantly written to three different memory cells, respectively. In a read operation, the data are read from the memory cells, and data determined by majority decision by using a majority logic circuit are output as read data.

BRIEF SUMMARY OF THE INVENTION

According to a first aspect of the present invention, there is provided a nonvolatile semiconductor memory device comprising: a memory cell which stores data by a difference in threshold voltage; latch circuits which store a plurality of read data obtained by performing a read operation on the memory cell twice or more under the same read conditions; and an arithmetic operation circuit which takes majority decision of said plurality of data stored in the latch circuits and decides the data determined by the majority decision as data stored in the memory cell.

According to a second aspect of the present invention, there is provided a nonvolatile semiconductor memory system comprising a nonvolatile semiconductor memory device and a controller. The nonvolatile semiconductor memory device includes a memory cell which stores data by a difference in threshold voltage; and latch circuits which store a plurality of read data obtained by performing a read operation on the memory cell twice or more under the same read conditions. The controller includes data latch circuits which store a plurality of data output from the latch circuits; and a majority decision circuit which takes majority decision of said plurality of data stored in the data latch circuits and decides data determined by the majority decision as data stored in the memory cell.

BRIEF DESCRIPTION OF THE SEVERAL VIEWS OF THE DRAWING

FIG. 1 is a diagram showing functional blocks and a configuration of a controller in a nonvolatile semiconductor memory device according to a first embodiment of the present invention;

FIG. 2 is a diagram showing a configuration of a memory cell array and a sense amplifier circuit in the nonvolatile semiconductor memory device according to the first embodiment;

FIG. 3 is a circuit diagram showing a configuration of a latch unit in the sense amplifier circuit in the first embodiment;

FIG. 4 is a circuit diagram showing a configuration of a sense amplifier unit in the sense amplifier circuit in the first embodiment;

FIG. 5 is a diagram showing a distribution of threshold voltages in a memory cell which can hold binary data;

FIG. 8 is a diagram showing a configuration of functional blocks in a nonvolatile semiconductor memory system according to a second embodiment of the present invention;

FIG. 9 is a circuit diagram showing a configuration of a read data latch circuit in the second embodiment.

DETAILED DESCRIPTION OF THE INVENTION

Figures 6, 7:
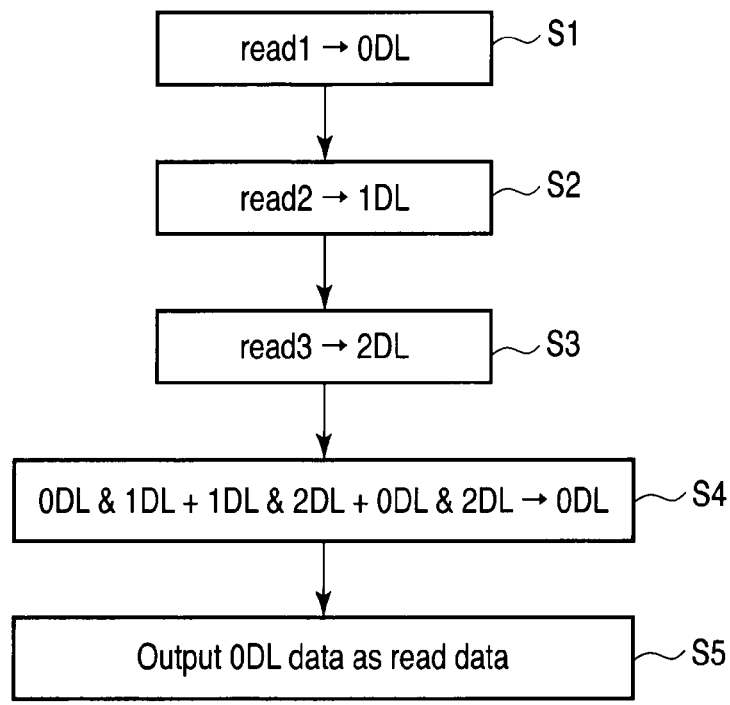
FIG. 6 is a diagram showing a flow of a read method in the nonvolatile semiconductor memory device according to the first embodiment.
FIG. 7 is a diagram showing an arithmetic operation result in the latch unit in the sense amplifier circuit in the first embodiment.

Embodiments of the present invention will be described below with reference to the accompanying drawings. In this description, the same reference numbers denote the same parts in all the drawings.

[First Embodiment]

A nonvolatile semiconductor memory device according to a first embodiment of the present invention will be described below.

FIG. 1 is a diagram showing functional blocks and a configuration of a controller in the nonvolatile semiconductor memory device according to the first embodiment.

As shown in FIG. 1, a nonvolatile semiconductor memory device 100 includes a memory cell array 1, a row decoder (word line control circuit) 2, a sense amplifier circuit 3, a column decoder 4, a data input/output buffer 5, an input/output control circuit 6, a control signal generating circuit 7, an address decoder 8, a control voltage generating circuit 9, and a parameter circuit 10. A controller 200 includes an external control signal generating circuit 11, an encoding circuit 12, and an error correction circuit 13.

The memory cell array 1 has a plurality of memory cells arranged in the form of a matrix by word lines in a row direction and bit lines in a column direction. In one memory cell, one bit or a plurality of bits can be stored by differences between threshold voltages. The row decoder (word line control circuit) 2 includes a word line drive circuit to select and drive the word lines connected to the memory cells in the memory cell array 1. The sense amplifier circuit 3 is connected to the bit lines connected to the memory cells in the memory cell array 1 and has a function of reading data from the memory cells through the bit lines and a data latch function of holding data (read data) read from the memory cells and write data. The column decoder 4 performs selection from the bit lines connected to the memory cells in the memory cell array 1. In the data read operation, data read from the memory cell to the sense amplifier circuit 3 is output to the input/output control circuit 6 through the data input/output buffer 5.

A command supplied from the input/output control circuit 6 through the data input/output buffer 5 is decoded by the control signal generating circuit 7. External control signals such as a chip enable signal /CE, a write enable signal /WE, a read enable signal /RE, an address latch enable signal ALE, and a command latch enable signal CLE are supplied to the control signal generating circuit 7.

The control signal generating circuit 7 performs sequence control of a data write operation and a data erase operation and control of a data read operation based on an external control signal and a command supplied depending on an operation mode. Various operations such as the read operation, the write operation, and the erase operation are controlled by the control signal generating circuit 7 to cause the control voltage generating circuit 9 to generate voltages for the various operations. An address supplied from the input/output control circuit 6 through the data input/output buffer 5 is transferred to the word line control circuit 2 and the column decoder 4 through the address decoder 8.

In the controller 200, the various control signals ALE, CLE, /CE, /WE, and /RE are generated by the external control signal generating circuit 11. The various control signals are transferred to the parameter circuit 10 in the memory device 100. In the encoding circuit 12, a redundant bit for error correction is calculated by external input data and added to input data, and the input data is transferred to the input/output control circuit 6 in the memory device 100. In contrast to this, the data read by the memory device 100 is transferred from the input/output control circuit 6 to the error correction circuit 13 in the controller 200. A defective bit included in the data transferred to the error correction circuit 13 is relieved by the error correction circuit 13. The resultant data is output to the outside.

In the embodiment, the error correction circuit 13 is arranged on the controller 200 side. However, an error correction circuit may be arranged on the nonvolatile semiconductor memory device 100 side.

FIG. 2 is a diagram showing a configuration of the memory cell array 1 and the sense amplifier circuit 3 in the nonvolatile semiconductor memory device according to the first embodiment.

The memory cell array 1 is configured such that a plurality of memory cells MC0 to MC31 connected in series and NAND cells including selection gate transistors SGST and SGDT connected to both ends of the memory cells are arranged. In other words, the memory cell array 1 is configured by arranging memory cells at matrix intersection points formed by word lines WL0 to WL31 arranged in the row direction and bit lines BL0 to BLn arranged in the column direction. Furthermore, a source line SRC is connected to the select gate transistor SGST, and a sense amplifier unit 3-1 is connected to the selection gate transistor SGDT.

A write voltage or a read voltage is applied to all transistors (memory cells) the gates of which are connected to each of the word lines to simultaneously perform a write or read operation. Write data or read data is held in the sense amplifier unit (SAU) 3-1, and holding of the data and formation of the read and write data are performed in a latch unit (LATU) 3-2 to hold and form data.

When the sense amplifier units 3-1 and the latch units 3-2 in the sense amplifier circuit 3 are to be accessed, data in only one of the sense amplifier units 3-1 and only one of the latch units 3-2 can be transferred to the data input/output buffer 5 by selection transistors STO to STn selected by the column decoder 4 shown in FIG. 1.

FIG. 3 is a circuit diagram showing a circuit configuration of the latch unit 3-2 in the sense amplifier circuit 3 in the first embodiment. Each of the latch units 3-2 has functions of a latch circuit and an arithmetic circuit. More specifically, each of the latch units 3-2 has latches 0DL to 3DL to hold data. It is assumed that each of the latch units 3-2 can hold 4-bit data in total. The latch unit 3-2 can process the data held in the latches 0DL to 3DL. That is, the latch unit 3-2 can realize operations which are equivalent to a logical product operation (AND) and a logical sum operation (OR). The latch unit 3-2 has P-channel MOS field-effect transistors (referred to as PMOS transistors hereinafter) 21, 27, 28, 29, 30, and 35, N-channel MOS field-effect transistors (referred to as NMOS transistors hereinafter) 22, 23, 24, 25, 26, 31, 32, 33, 34, and 36, a pass transistor 37, and inverters IV1 to IV5.

A concrete example of an operation performed in the latch unit 3-2 will be described below with reference to FIG. 3. As an example, an operation of transferring a result obtained by calculating a logical product of the latch 0DL and the latch 1DL to the latch 2DL will be described below.

First, a signal SET1 and a signal SET2 are made low to electrically charge a node LAT and a bus BUS, respectively. A Signal SEL of the pass transistor 37 in the latch 0DL is made high. When a node DATA of the latch 0DL is high, that is, when data held in the latch 0DL is high, the bus BUS is electrically discharged by the inverter of the latch 0DL. Conversely, when the data held in the latch 0DL is low, the bus BUS is kept high. With this operation, data obtained by inverting the data held in the latch 0DL is consequently transferred to the bus BUS.

The moment a signal LATL is made high, the node LAT is equalized (high). In this case, when the bus BUS is high (latch 0DL is low), the node LAT is electrically discharged. When the bus BUS is low (latch 0DL is high), the node LAT is kept high. As a result, the data in the latch 0DL is transferred to the node LAT. More specifically, a transfer operation expressed by 0DL→LAT is completed.

The signal SET2 is made low to electrically charge the bus BUS to high. Thereafter, the signal SEL of the pass transistor 37 in the latch 1DL is made high. In this case, when the node DATA of the latch 1DL is high, that is, when the data held in the latch 1DL is high, the bus BUS is electrically discharged by the inverter of the latch 1DL. Conversely, when the data held in the latch 1DL is low, the bus BUS is kept high. With this operation, data obtained by inverting the data held in the latch 1DL is consequently transferred to the bus BUS.

The moment the signal LATL is made high, the node LAT is equalized (high). In this case, when the bus BUS is high (latch 1DL is low), the node LAT is electrically discharged. When the bus BUS is low (latch 1DL is high), the node LAT is kept high. With the series of operations, when neither the latch 0DL nor 1DL is high, the node LAT is electrically discharged. As a result, a result obtained by calculating a logical product of the latches 0DL and 1DL is transferred to the node LAT. More specifically, a transfer operation expressed by 0DL & 1DL→LAT is consequently completed. Note that "&" means the logical product.

When a signal SEL2 is made low, the bus BUS is electrically charged to high again. Thereafter, when a signal BUSL1 is made high and a signal LAT (node LAT) is high, the bus BUS is electrically discharged. When the signal LAT is low, the bus BUS is kept high. As a result, data obtained by inverting the data held in the node LAT is transferred to the bus BUS. More specifically, a transfer operation expressed by LATn (n means inversion)→BUS is completed.

Finally, the latch 2DL is equalized to turn on the pass transistor 37 of the latch 2DL. When the bus BUS is low, the node DATA is made high. When the bus BUS is high, the node DATA is made low. As a result, data obtained by inverting the data held in the bus BUS is transferred to the latch 2DL. More specifically, a transfer operation expressed by BUSn (n means inversion)→2DL is completed. With the above operation, a result obtained by calculating a logical product of the latch 0DL and 1DL is transferred to the latch 2DL. More specifically, a transfer operation expressed by 0DL & 1DL→2DL is consequently completed.

As the next example, an operation of transferring a result obtained by calculating a logical sum of the latches 0DL and 1DL to the latch 2DL will be described below.

First, the signal SET1 and the signal SET2 are made low to electrically charge the node LAT and the bus BUS, respectively. As in the logical product operation described above, an operation of transferring data obtained by inverting the data held in the latch 0DL to the bus BUS is performed. More specifically, an operation expressed by 0DLn→BUS is performed.

The moment a signal LATH is made high, the node LAT is equalized (high). In this case, when the bus BUS is low (latch 0DL is high), the node LAT is electrically discharged. When the bus BUS is high (latch 0DL is low), the node LAT is kept high. With this operation, data obtained by inverting the data held in the latch 0DL is transferred to the node LAT. More specifically, a transfer operation expressed by 0DLn→LAT is completed. Similarly, after the inverted data of the latch 1DL is transferred to the bus BUS, the signal LATH is made high to transfer the data obtained by inverting the data held in the latch 1DL to the node LAT. As a result, a transfer operation expressed by 0DLn & 1DLn→LAT is completed.

The Signal SET2 is made low, and the bus BUS is electrically charged to high again. Thereafter, a signal BUSH1 is made high. In this case, when a signal LATn (inverted data of the node LAT) is high, the bus BUS is electrically discharged. When the signal LATn is low, the bus BUS is kept high. As a result, the data held in the node LAT is transferred to the bus BUS. More specifically, a transfer operation expressed by LAT→BUS is completed.

Finally, the latch 2DL is equalized to turn on the pass transistor 37 of the latch 2DL. In this case, when the bus BUS is low, the node DATA goes high. When the bus BUS is high, the node DATA goes low. As a result, data obtained by inverting the data held in the bus BUS is transferred to the latch 2DL. More specifically, a transfer operation expressed by BUSn (n means inversion)→2DL is completed. With the above operation, (0DLn & 1DLn)n→0DL+1DL→2DL is completed. Note that "+" means the logical sum. Thereafter, by using the operations of two types, i.e., the logical product operation (&) and the logical sum operation (+), operations according to the embodiment of the present invention will be described below.

A read operation in the first embodiment will be described below with reference to FIG. 4. FIG. 4 is a circuit diagram showing a configuration of the sense amplifier unit 3-1 in the sense amplifier circuit 3. The sense amplifier unit 3-1 includes a plurality of PMOS transistors 41, 42, and 43, a plurality of NMOS transistors 45, 46, 47, 48, 49, and 50, and a latch circuit LAT1 configured by, for example, a clocked inverter circuit.

The source of the PMOS transistor 41 is connected to a node to which a power supply voltage VDD is supplied, and the drain of the PMOS transistor 41 is connected to the latch unit 3-2 through the NMOS transistors 45 and 46. A Signal BLC1 is supplied to the gate of the PMOS transistor 41, and signals BLC2 and BLC3 are supplied to the gates of the NMOS transistors 45 and 46, respectively. A connection node between the NMOS transistor 45 and the NMOS transistor 46 is connected to the bit line BL and grounded through the NMOS transistors 47 and 48, respectively. The gate of the NMOS transistor 47 is connected to a node INV of the latch circuit LAT1, and the NMOS transistor 47 is controlled by data held in the latch circuit LAT1. Furthermore, a signal DIS is supplied to the gate of the NMOS transistor 48.

The source of the PMOS transistor 42 is connected to a node to which the power supply voltage VDD is supplied, and the drain of the PMOS transistor 42 is connected to the latch unit 3-2 through the PMOS transistor 43 and the NMOS transistors 49 and 50. A Signal BLC4 is supplied to the gate of the PMOS transistor 42, and the gate of the PMOS transistor 43 is connected to the connection node between the PMOS transistor 41 and the NMOS transistor 45 through the NMOS transistor 44. A signal XXL is supplied to the gate of the NMOS transistor 44, and a reset signal RST is supplied to the gate of the NMOS transistor 49. The node INV of the latch circuit LAT1 is connected to the connection node between the PMOS transistor 43 and the NMOS transistor 49. An inversion node of the latch circuit LAT1 is connected to the latch unit 3-2 through the NMOS transistor 50. A signal BLC5 is supplied to the gate of the NMOS transistor 50.

A read operation in the sense amplifier unit shown in FIG. 4 will be schematically described below.

When data is read from the memory cell, the signals BLC1, BLC3, DIS, and XXL are made low, the signal BLC2 is made high, and the bit line is electrically charged to high. Thereafter, the signal BLC2 is made low, and a read voltage is supplied to the selection word line.

When a threshold voltage of a memory cell is higher than the read voltage, the memory cell is off, and the bit line is kept high. When the threshold voltage of the memory cell is lower than the read voltage, the memory cell is turned on, and electric charges on the bit line are discharged. For this reason, the bit line goes low. The Signal BLC3 goes high, and a potential of the bit line is read to the latch unit 3-2.

A problem to be solved by the present invention will be described below in detail with reference to FIG. 5. FIG. 5 is a diagram showing a distribution of threshold voltages in memory cells which can hold binary data.

An area near the center of the abscissa indicates a read voltage. When attention is paid to a foot portion of the threshold voltage, a memory cell having a threshold value at an upper foot portion of binary 1 and a memory cell having a threshold value at a lower foot portion of binary 0 have threshold values close to the read voltage. In these memory cells, with the miniaturization of the process, it is confirmed that unstable motion of electrons between a floating gate and a substrate looks large as a threshold value or that, because of the influence of noise on the read voltage, data tends not to be correctly stable (random error), for example, the data is determined as binary 0 or binary 1. In the embodiment of the present invention, a method to read the unstable data as correct data is proposed.

FIG. 6 is a diagram showing a flow of a read method in the nonvolatile semiconductor memory device according to the first embodiment.

A first read operation (read 1) is performed on a memory cell to be read, and a read result is stored in the latch 0DL in the latch unit 3-2 (step S1). A second read operation (read 2) is performed on the same memory cell as that on which the first read operation is performed, and a read result is stored in the latch 1DL in the latch unit 3-2 (step S2). Finally, a third read operation (read 3) is performed on the same memory cell as that on which the first and second read operations are performed (read 3), and a read result is stored in the latch 2DL in the latch unit 3-2 (step S3). It is assumed that all read conditions in the first to third read operations, for example, read voltages are set to be equal. The first to third read operations are performed on each of the plurality of memory cells.

By using the logical product operation (&) and the logical sum operation (+) in the latch unit 3-2 described above, an operation expressed by 0DL & 1DL+1DL & 2DL+0DL & 2DL→0DL is performed (step S4). More specifically, this operation is realized such that, operations expressed by 0DL & 1DL→3DL, 1DL & 2DL→1DL, 1DL+3DL→3DL, 0DL & 2DL→0DL, 0DL+3DL→0DL are performed by using the latch 3DL to hold intermediate data. Thereafter, data stored in the latch 0DL is output as data (read data) stored in the memory cell (step S5).

In this case, an arithmetic operation result obtained by performing an operation expressed by 0DL & 1DL+1DL & 2DL+0DL & 2DL is shown in FIG. 7 as a table together with all combinations of values in the latches 0DL to 2DL. According to this table, when each of binary 1 and binary 0 is read twice or more, data is determined as binary 1 or binary 0. That is, it is understood that majority decision can be realized. As a result, the majority decision is taken to make it possible to improve the accuracy of determining whether the data stored in the memory cell is binary 0 or binary 1.

As described above, according to the embodiment, in a read operation for a memory cell having a threshold value close to a read voltage, the accuracy of reading data stored in the memory cell can be improved in comparison with a read operation which is generally performed only once. As a result, even though the correcting capability (number of correctable bits) of the error correction circuit 13 is reduced, read data can be sufficiently corrected.

In the embodiment, for the sake of simplicity, the read operation is performed only three times. However, the read operation may be performed 5, 7, . . . , 2n+1 (n is an integer greater than or equal to 1) times, and majority decision of these results is taken to make it possible to further improve the accuracy of data.

[Second Embodiment]

A nonvolatile semiconductor memory system according to a second embodiment of the present invention will be described below. The same reference numbers as in the configuration in the first embodiment denote the same parts in the second embodiment.

In the second embodiment, majority decision is not performed in a latch unit in the memory device 100, and the majority decision is performed by using a read data latch circuit and a majority decision circuit which are added to the controller 200.

FIG. 8 is a diagram showing a configuration of functional blocks in a nonvolatile semiconductor memory system according to the second embodiment of the present invention. As shown in FIG. 8, in the second embodiment, in the configuration shown in FIG. 1, a read data latch circuit 14 and a majority decision circuit 15 is additionally arranged in the controller 200. The read data latch circuit 14 stores data output from the input/output control circuit 6. The majority decision circuit 15 takes majority decision of data stored in the data latch circuit 14 and adopts data decided by the majority decision as data (read data) stored in the memory cell.

FIG. 9 shows a circuit configuration of the read data latch circuit 14. The read data latch circuit 14 has an input data selector 14-1 and a shift register group 14-2. In the shift register group 14-2, 2n+1 (n is an integer greater than or equal to 1) m-bit shift registers, obtained by connecting m (m is an integer greater than or equal to 1) flip-flops in series, are formed. As the majority decision circuit 15, for example, a circuit equivalent to the latch unit 3-2 described in the first embodiment may be used.

When an output from the nonvolatile semiconductor memory device 100 side, i.e., read data is read to the controller 200 side, depending on the number of the read data, the input data selector 14-1 determines a specific data latch into which the data is sorted in the shift register group 14-2. When all the shift registers are filled by the 2n+1 read operations, majority decision of the data stored in the shift register group 14-2 is taken by the majority decision circuit 15, and major data is transferred to the error correction circuit 13 as data stored in the memory cell.

With the above operation, even though majority decision is performed outside the nonvolatile semiconductor memory device, for example, in a controller, in a read operation on a memory cell having a threshold value close to a read voltage, the accuracy of reading data stored in the memory cell can be improved in comparison with a read operation which is generally performed only once. As a result, even though the correcting capability (number of correctable bits) of the error correction circuit 13 is reduced, read data can be sufficiently corrected. The other configurations and advantages are the same as those in the first embodiment.

[Third Embodiment]

A nonvolatile semiconductor memory device according to a third embodiment of the present invention and a system therefor will be described below. In the third embodiment, a flow of a read method which is different from those used in the configurations described in the first and second embodiments is used. The other configurations are the same as those in the first and second embodiments.

Figure 10:
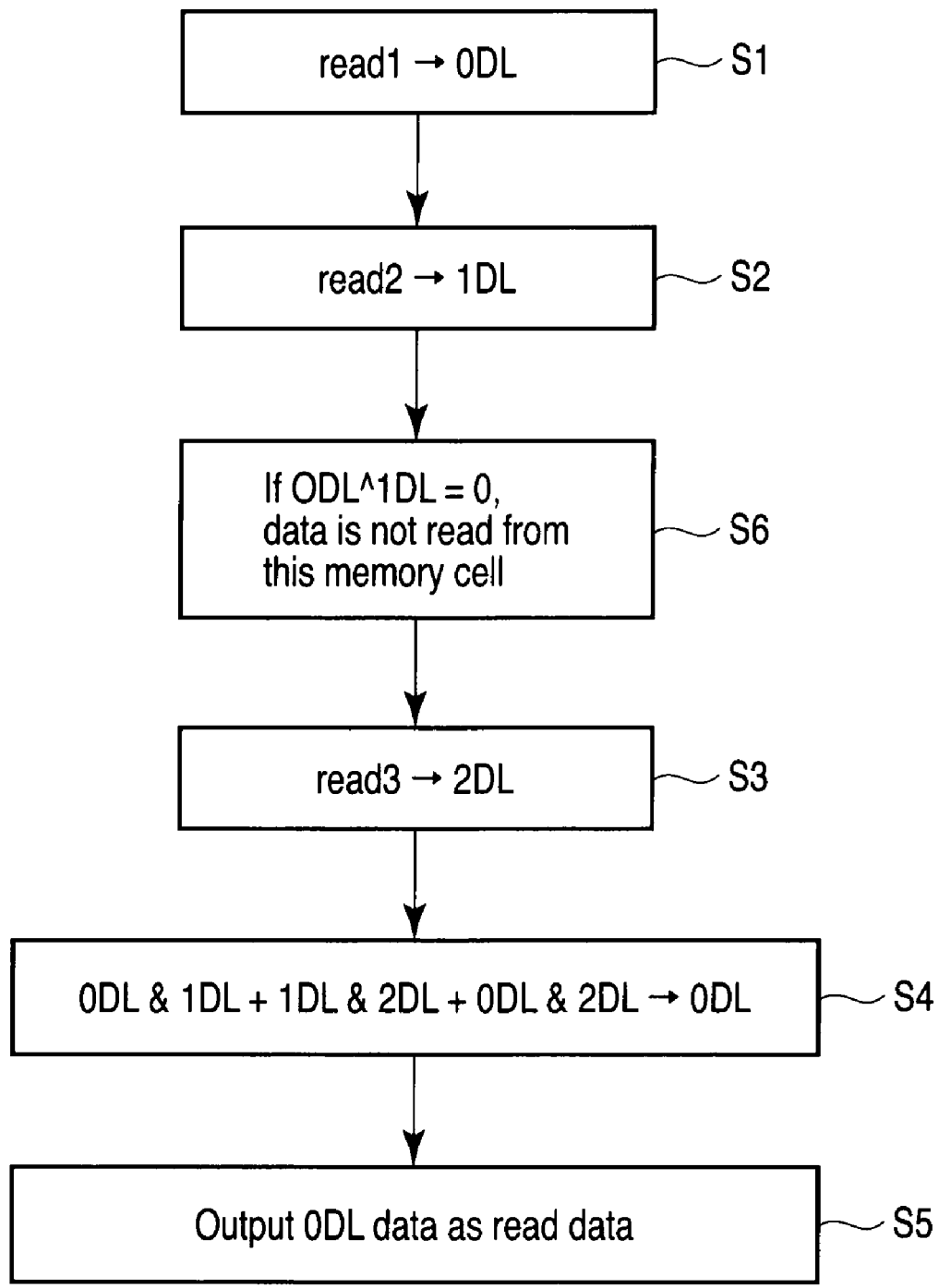
FIG. 10 is a diagram showing a flow of a read method in a third embodiment of the present invention.

FIG. 10 is a diagram showing a flow of a read method in the third embodiment.

To a memory cell to be read, results obtained by a first read operation (read 1) and a second read operation (read 2) are stored in latches 0DL and 1DL, respectively (steps S1 and S2). Subsequently, an exclusive OR (XOR) of results stored in the latches 0DL and 1DL is calculated. In this case, when the result of the exclusive-OR operation is 0, that is, when the results of read 1 and read 2 are equal, a bit line of the memory cell to be read at this time is not pre-charged (step S6), and a third read operation (read 3) is performed. A read result is stored in the latch 2DL (step S3).

In this case, in steps S6 and S3, since the bit line of the memory cell in which the results of read 1 and read 2 are equal is not pre-charged, a third read operation is not performed on the memory cell. As described above, it is assumed that all read conditions in the first to third read operations, for example, read voltages are set to be equal.

By using the logical product operation (&) and the logical sum operation (+) in the latch unit 3-2 described above, an operation expressed by 0DL & 1DL+1DL & 2DL+0DL & 2DL→0DL is performed (step S4). Thereafter, data stored in the latch 0DL is output as data (read data) stored in the memory cell (step S5).

In the third embodiment, when the results of the first read operation and the second read operation are equal, a bit line of a memory cell to be read in this case is not pre-charged, and only bit lines of the other memory cells are pre-charged. More specifically, the third read operation is not performed on the memory cell in which the results of the first and second read operations are equal. In this manner, for the memory cell in which the results of the first and second read operations are equal, read data from the memory cell is fixed without considering the result of the third read operation (read 3). More specifically, when read 3 is performed on the memory cell in which the results of the first and second read operations are different from each other, read 3 is not performed on the memory cell in which the results of the first and second read operations are equal, and a lock-out operation in which a bit line of the memory cell is not pre-charged while holding the results of the read operation is performed. In this manner, read 3 is prevented from being performed on the memory cell in which the results of the first and second read operations are equal, to thereby make it possible to expect an effect of moderating noise generated by electric charging and discharging of the bit line of the memory cell and influenced on an adjacent bit line.

In the embodiments of the present invention, majority decision of results obtained by reading the same memory cell twice or more at the same read voltage is taken to detect a memory cell having a random error. Based on the result of the majority decision, a major result is decided as read data. In this manner, the probability of a random error occurring is reduced to make it possible to realize a reduction in the correcting capability of error checking and correction (ECC) in an error correction circuit.

According to the embodiments of the present invention, there can be provided a nonvolatile semiconductor memory device which can correct a random error in which data stored in a memory cell is correctly read or erroneously read in a read operation from the memory cell. In other words, a nonvolatile semiconductor memory device which can reduce the probability of a random error occurring in a read operation can be provided.

In the embodiments of the present invention, a nonvolatile semiconductor memory device which can correct a random error occurring in a read operation of a memory cell and a system therefor can be provided.

The embodiments described above can be not only independently executed, but also executed in appropriate combination with each other. Furthermore, each of the embodiments described above includes inventions in various phases. The inventions in the various phases can also be extracted by appropriately combining a plurality of constituent elements disclosed in the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell which stores data by a difference in threshold voltage;
   latch circuits which store a plurality of read data obtained by performing a read operation on the memory cell twice or more under the same read conditions; and
   an arithmetic operation circuit which takes majority decision of said plurality of data stored in the latch circuits and decides the data determined by the majority decision as data stored in the memory cell,
   wherein the read operation which is performed twice or more is executed 2n+1 times, and the arithmetic operation circuit decides identical data stored in the latch circuits and read n+1 times or more in the 2n+1 read operations as the data stored in the memory cell (where n is an integer greater than or equal to 1), and
   wherein, when the identical data stored in the latch circuits is read n+1 times, subsequent read operations are not executed, and the arithmetic operation circuit decides the identical data as the data stored in the memory cell.

2. The nonvolatile semiconductor memory device according to claim 1,
   wherein, in the read operation performed twice or more, the same read voltage is applied to the memory cell.

3. The nonvolatile semiconductor memory device according to claim 1,
   wherein the arithmetic operation circuit performs a logical product operation and a logical sum operation on said plurality of data stored in the latch circuits to take the majority decision of said plurality of data.

4. The nonvolatile semiconductor memory device according to claim 1,
   wherein the memory cell stores data of a plurality of bits.

5. The nonvolatile semiconductor memory device according to claim 1,
   wherein the memory cell is arranged in a memory cell array, and the memory cell array includes a plurality of memory cells arranged in the form of a matrix by word lines in a row direction and bit lines in a column direction.

6. A nonvolatile semiconductor memory system comprising:
   a nonvolatile semiconductor memory device including:
      a memory cell which stores data by a difference in threshold voltage; and
      latch circuits which store a plurality of read data obtained by performing a read operation on the memory cell twice or more under the same read conditions;
   a controller including:
      data latch circuits which store a plurality of data output from the latch circuits; and
      a majority decision circuit which takes majority decision of said plurality of data stored in the data latch circuits and decides data determined by the majority decision as data stored in the memory cell,
   wherein the read operation which is performed twice or more is executed 2n+1 times, and the majority decision circuit decides identical data stored in the data latch circuits and read n+1 times or more in the 2n+1 read operations as the data stored in the memory cell (where n is an integer greater than or equal to 1), and
   wherein, when the identical data stored in the data latch circuits is read n+1 times, subsequent read operations are not executed, and the majority decision circuit decides the identical data as the data stored in the memory cell.

7. The nonvolatile semiconductor memory system according to claim 6,
   wherein, in the read operation performed twice or more, the same read voltage is applied to the memory cell.

8. The nonvolatile semiconductor memory system according to claim 6,
   wherein the majority decision circuit performs a logical product operation and a logical sum operation on said plurality of data stored in the data latch circuits to take the majority decision of said plurality of data.

9. The nonvolatile semiconductor memory system according to claim 6,
   wherein the memory cell stores data of a plurality of bits.

10. The nonvolatile semiconductor memory system according to claim 6,
    wherein the memory cell is arranged in a memory cell array, and the memory cell array includes a plurality of memory cells arranged in the form of a matrix by word lines in a row direction and bit lines in a column direction.

* * * * *